United States Patent [19]
Scheckel et al.

[11] Patent Number: 5,557,649
[45] Date of Patent: Sep. 17, 1996

[54] CIRCUIT CONFIGURATION FOR DIVIDING A CLOCK SIGNAL

[75] Inventors: Bruno Scheckel, Ebersberg; Stefan Heinen, Krefeld; Jean Wilwert; Helmut Herrmann, both of München, all of Germany

[73] Assignee: Siemens Aktiengesellschaft, Munich, Germany

[21] Appl. No.: 442,790

[22] Filed: May 17, 1995

[30] Foreign Application Priority Data

May 17, 1994 [DE] Germany ............... 44 17 147.1

[51] Int. Cl.$^6$ ................................. H03K 23/66
[52] U.S. Cl. ................. 377/48; 377/110; 377/117
[58] Field of Search ............... 377/48, 108, 110, 377/117

[56] References Cited

U.S. PATENT DOCUMENTS

| | | | |
|---|---|---|---|
| 4,606,059 | 8/1986 | Oida | 377/108 |
| 4,703,495 | 10/1987 | Bereznak | 377/108 |
| 5,077,764 | 12/1991 | Yamashita | 377/116 |
| 5,349,622 | 9/1994 | Gorisse | 377/48 |

OTHER PUBLICATIONS

Plessey Semiconductor Publ. No. SP8690/1A&B, pp. 113–117, High Speed Dividers Integrated Circuit Handbook.

*Primary Examiner*—Margaret Rose Wambach
*Attorney, Agent, or Firm*—Herbert L. Lerner; Laurence A. Greenberg

[57] ABSTRACT

A circuit configuration being made by differential technology for dividing a clock signal with switchable divider ratios of 4/5 by emitter coupled logic, includes first, second and third series-connected flip-flops each having an output, a data input and a clock input. The output of the second flip-flop is coupled to the data input of the third flip-flop, and the clock inputs of the first, second and third flip-flops are acted upon by a clock signal. A first AND gate is connected upstream of the first flip-flop and has a first input being acted upon by a control signal for switching over the divider ratio, and a second input being acted upon by an inverted signal from the output of the third flip-flop. A second AND gate is connected between the first and second flip-flops and has an output connected to the data input of the second flip-flop, a first input receiving an inverted signal from the output of the first flip-flop, and a second input being acted upon by the inverted signal from the output of the third flip-flop.

2 Claims, 1 Drawing Sheet

CIRCUIT CONFIGURATION FOR DIVIDING A CLOCK SIGNAL

BACKGROUND OF THE INVENTION

1. Field of the Invention

The invention relates to a circuit configuration for dividing a clock signal with switchable or reversible divider ratios of 4/5 by emitter coupled logic, having three series-connected flip-flops, wherein a positive output of one flip-flop is coupled to a data input of a respective downstream flip-flop, and clock inputs of the flip-flops are acted upon by the clock signal.

In the development of cellular or cordless telephones, the present goal is a 2.7 V supply voltage. It is therefore necessary to make available bipolar predividers with low current consumption for that supply voltage. That leads to problems in particular in achieving the required rapid synchronized 4/5 divider.

One such divider circuit configuration is known, for instance, from the "SP8000 Series High Speed Dividers Integrated Circuit Handbook" issued by Plessey Semiconductors, pp. 113 ff. A divider component SP8690A&B is made by emitter coupled logic (ECL) and requires a supply voltage of 5 V. The divider is constructed as a three-stage Johnson counter shown in FIG. 2 of the aforementioned handbook. In the case of the 2.7 V ECL circuitry, the gates can no longer be constructed in such a way that their transit time is eliminated. In other words, the transit times of the gates that precede the flip-flops add together and lead to a reduction in the upper limit frequencies.

2. Summary of the Invention

It is accordingly an object of the invention to provide a circuit configuration made by ECL which enables a divider circuit configuration with a high limit frequency and a low supply voltage to be provided and which overcomes the hereinafore-mentioned disadvantages of the heretofore-known devices of this general type.

With the foregoing and other objects in view there is provided, in accordance with the invention, a circuit configuration being made by differential technology for dividing a clock signal with switchable divider ratios of 4/5 by emitter coupled logic, comprising first, second and third series-connected flip-flops each having an output, a data input and a clock input, the output of the second flip-flop being coupled to the data input of the third flip-flop, and the clock inputs of the first, second and third flip-flops being acted upon by a clock signal; a first AND gate being connected upstream of the first flip-flop and having a first input being acted upon by a control signal for switching over the divider ratio, and a second input being acted upon by an inverted signal from the output of the third flip-flop; a second AND gate being connected between the first and second flip-flops and having an output connected to the data input of the second flip-flop, a first input receiving an inverted signal from the output of the first flip-flop, and a second input being acted upon by the inverted signal from the output of the third flip-flop.

In accordance with another feature of the invention, there are provided n divider stages (n≦1) each having a flip-flop and an OR stage including first and last flip-flops and first and last OR stages; each of the flip-flops of the divider stages except the last flip-flop having an inverted output, each of the flip-flops of the divider stages having a clock input, and each of the OR stages having a first input, a second input and an output; the flip-flops of the divider stages being connected in series with the output of the third flip-flop, with the inverted outputs of each of the third flip-flop and the flip-flops of the divider stages each being connected to the clock input of a respective one of the flip-flops being connected downstream; the n series-connected OR gates being connected upstream of the first input of the first AND gate, with the first input of each of the OR gates except for the first OR gate each being acted upon by an output signal from the output of a respective one of the OR gate being connected upstream, the second input of each of the OR gates except for the first OR gate receiving an inverted output signal from the inverted output of a respective one of the flip-flops of the divider stages, the first input of the first OR gate receiving a control signal, and the output of the last OR gate being connected to the first input of the first AND gate.

In accordance with a concomitant feature of the invention, there is provided a multiplexer receiving at least two output signals of two of the series-connected flip-flops and having an output at which a divided clock signal can be picked up.

Other features which are considered as characteristic for the invention are set forth in the appended claims.

Although the invention is illustrated and described herein as embodied in a circuit configuration for dividing a clock signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
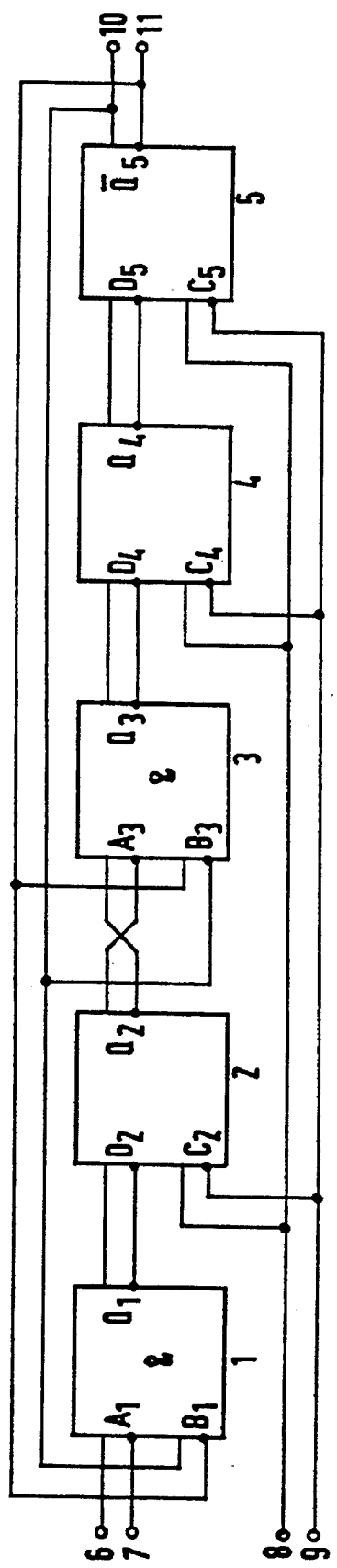
FIG. 1 is a basic schematic circuit diagram of a 4/5 divider.

Referring now to the figures of the drawing in detail and first, particularly, to FIG. 1 thereof, there is seen a first AND gate 1 having a differential input terminal $A_1$ that is connected to connection terminals 6, 7. These connection terminals can be supplied to a differential control signal. An output $Q_1$ of the AND gate 1 is likewise constructed differentially and is connected to a differential input $D_2$ of a first flip-flop 2. An output $Q_2$ of the flip-flop is connected with pole transition to a first input $A_3$ of a second AND gate 3, so that the AND gate 3 is supplied with the inverted output signal of the flip-flop 2. A second differential input $B_3$ is connected in inverted fashion to a second differential input $B_1$ of the first AND gate 1. A differential output $Q_3$ of the AND gate 3 is interconnected with a differential input $D_4$ of a second flip-flop 4. An output $Q_4$ of this flip-flop is in turn interconnected with a differential input $D_5$ of a third flip-flop 5. An inverting output $\overline{Q}_5$ is interconnected on one hand with output terminals 10, 11 and on the other hand with the respective second inputs $B_1$, $B_3$ of the two AND gates 1, 3. Clock inputs $C_2$, $C_4$, $C_5$ of the three flip-flops 2, 4, 5 are each supplied with a clock signal that can be delivered through connection terminals 8, 9.

A configuration according to the invention as shown in FIG. 1 has a 4/5 divider with an optimized transit time. The illustrated circuit of the 4/5 divider offers the advantage of ensuring that in the division by four mode, or in other words when there is a logical "0" signal at the control input 6, 7, the fed back D flip-flop 2 does not change its state, and thus the upper limit frequency is determined only by the properties of the blocks 3, 4, 5. Applying a logical "1" to the differential control input 6, 7 switches the entire configuration into the so-called division by 5 mode, in which the transit times of the gates 1 and 3 are decoupled by the flip-flop 2, and therefore this circuit structure leads to a higher limit frequency at the same current consumption. Moreover, this configuration enables a compact layout with low parasitic influences, because only a differential signal is fed back from a low-impedance output, such as an emitter follower, by the flip-flop 5 to the two AND gates 1, 3.

As compared with the circuits known thus far, which function with non-differential signals, the circuit according to the invention has been made entirely in a differential ECL circuitry mode for a 2.7 V supply voltage. Only a differential signal is fed back from a low-impedance output, and the transit time of the gates which is required is decoupled by a flip-flop. These three provisions have the following advantages, namely lower current consumption at a given upper limit frequency, greater signal-to-noise ratio, and lower phase noise.

Figure 2:
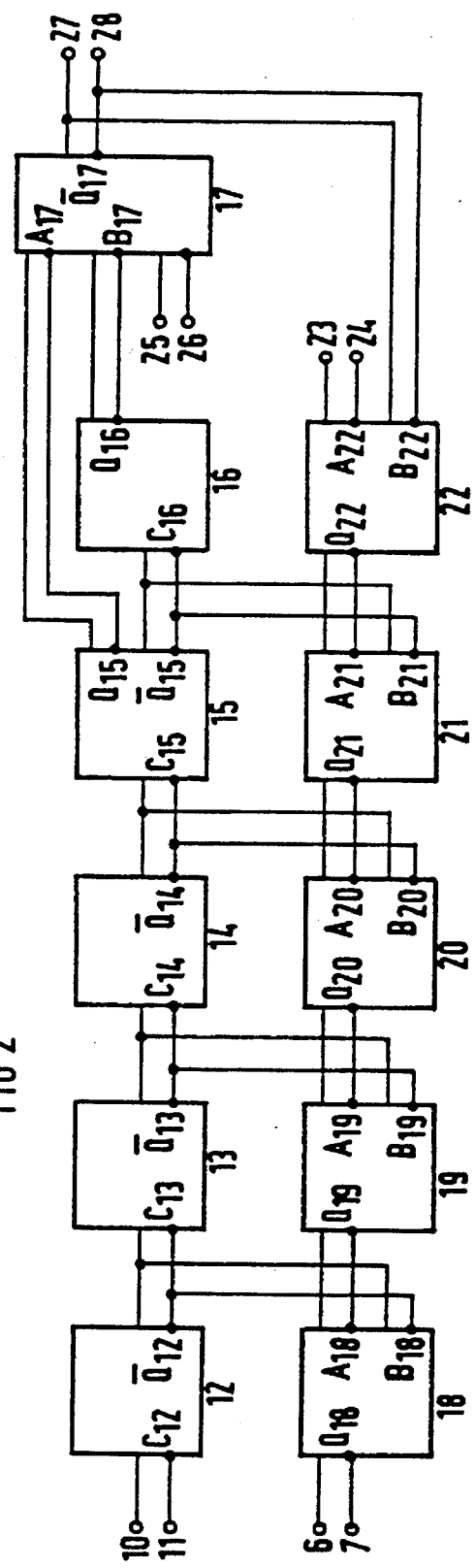
FIG. 2 is a diagram of an expansion circuit for the divider of FIG. 1 to make a $2^n/2^{n+1}$ divider.

In a simple further feature of the invention, the 4/5 divider can be expanded to make a $2^n/2^{n+1}$ divider which can be switched over or reversed. This kind of expansion to a 64/65 or 128/129 divider is shown in FIG. 2. Once again the output terminals of the 4/5 divider shown in FIG. 1 are indicated at reference numerals 10, 11 and in FIG. 2 they are connected to a differential clock input $C_{12}$ of a further flip-flop 12. This flip-flop 12 can be followed by an arbitrary number of further flip-flops which are connected in series. In each case, an inverting output $\overline{Q}_n$ is connected to a respective clock input $C_n$ of the following flip-flop. In the example shown in FIG. 2, five flip-flops 12, 13, 14, 15, 16, including a first flip-flop 12 and a last flip-flop 16, are connected in series in this way. Moreover, one respective OR gate is associated each flip-flop. OR gates, including a first OR gate 22 and a last OR gate 18 are also provided. An output $Q_{18}$ of the last OR gate 18 is connected to the differential control terminals 6, 7. The following four further OR gates 19, 20, 21, 22 are connected in series in such a way that each first differential input $A_{18}, A_{19}, A_{20}, A_{21}$ is connected to a respective output $Q_{19}, Q_{20}, Q_{21}, Q_{22}$ of the preceding OR gate 19, 20, 21, 22. Each second input $B_{18}, B_{19}, B_{20}, B_{21}$ is connected to the inverting output $\overline{Q}_{12} \ldots \overline{Q}_{15}$ of the respectively associated flip-flop 12 ... 15. A differential control signal for switchover of the divider mode is supplied through input terminals 23, 24 to a first input $A_{22}$ of the first OR gate 22. A multiplexer 17 is also provided with first and second differential inputs $A_{17}, B_{17}$ and one differential inverting output $\overline{Q}_{17}$. Reference numerals 25 and 26 indicate input terminals for supplying a differential control signal for the multiplexer 17. The first input $A_{17}$ of the multiplexer 17 is connected to an output $Q_{15}$ of the flip-flop 15 in the illustrated example. The second input $B_{17}$ of the multiplexer 17 is connected to an output $Q_{16}$ of the flip-flop 16. A differential inverted output signal can be picked up from the output $\overline{Q}_{17}$ at terminals 27, 28, and it is also supplied to a second input $B_{22}$ of the OR gate 22.

The exemplary embodiment shown in FIG. 2 shows a 64/65 or a 128/129 divider. By applying a control signal to the terminals 25, 26, either the 64/65 mode or the 128/129 mode can be selected. Between the respective two divider modes, the mode of operation at a given time can be chosen by applying a differential control signal to the terminals 23, 24.

Other divider ratios can be achieved by leaving out one flip-flop and OR combination, such the flip-flop 12 and the associated OR gate 18, or by cascading one additional stage. Through a multiplexer, an arbitrary differential output signal or a plurality of arbitrary differential output signals can be selected and supplied to the actual output of the divider circuit. In the illustrated example of FIGS. 1 and 2, the output signals of the flip-flops 5, 12, 13, 14, 15, 16 would then be selectable arbitrarily, so that a switch could be made among 4/5, 8/9, 16/17, 32/33, 64/65 and 128/129 dividers.

We claim:

1. A circuit configuration being made by differential technology for dividing a clock signal with switchable divider ratios of 4/5 by emitter coupled logic, comprising:

first, second and third series-connected flip-flops each having an output, a data input and a clock input, said output of said second flip-flop being coupled to said data input of said third flip-flop, and said clock inputs of said first, second and third flip-flops being acted upon by a clock signal;

a first AND gate being connected upstream of said first flip-flop and having a first input being acted upon by a control signal for switching over the divider ratio, and a second input being acted upon by an inverted signal from said output of said third flip-flop;

a second AND gate being connected between said first and second flip-flops and having an output connected to said data input of said second flip-flop, a first input receiving an inverted signal from said output of said first flip-flop, and a second input being acted upon by the inverted signal from said output of said third flip-flop; and n divider stages (n≦1) each having a flip-flop and an OR stage including first and last flip-flops and first and last OR stages;

each of said flip-flops of said divider stages except said last flip-flop having an inverted output, each of said flip-flops of said divider stages having a clock input, and each of said OR stages having a first input, a second input and an output;

said flip-flops of said divider stages being connected in series with said output of said third flip-flop, with said inverted outputs of each of said third flip-flop and said flip-flops of said divider stages each being connected to said clock input of a respective one of said flip-flops being connected downstream;

said n series-connected OR gates being connected upstream of said first input of said first AND gate, with said first input of each of said OR gates except for said first OR gate each being acted upon by an output signal from said output of a respective one of said OR gate being connected upstream, said second input of each of said OR gates except for said first OR gate receiving an inverted output signal from said inverted output of a respective one of said flip-flops of said divider stages, said first input of said first OR gate receiving a control signal, and said output of said last OR gate being connected to said first input of said first AND gate.

2. The circuit configuration according to claim 1, wherein n is equal or greater than 2, and including a multiplexer receiving at least two output signals of two of said series-connected flip-flops and having an output at which a divided clock signal can be picked up.

* * * * *